US010135419B2

(12) United States Patent
Hirano et al.

(10) Patent No.: US 10,135,419 B2
(45) Date of Patent: Nov. 20, 2018

(54) SURFACE ACOUSTIC WAVE DEVICE

(71) Applicant: Murata Manufacturing Co., Ltd., Nagaokakyo-shi, Kyoto-fu (JP)

(72) Inventors: Yasuhiko Hirano, Nagaokakyo (JP); Daisuke Sekiya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 155 days.

(21) Appl. No.: 15/375,360

(22) Filed: Dec. 12, 2016

(65) Prior Publication Data
US 2017/0187353 A1 Jun. 29, 2017

(30) Foreign Application Priority Data
Dec. 24, 2015 (JP) .................. 2015-252619

(51) Int. Cl.
*H03H 9/10* (2006.01)
*H03H 9/64* (2006.01)
*H03H 9/72* (2006.01)
*H03H 9/05* (2006.01)
*H03H 9/02* (2006.01)

(52) U.S. Cl.
CPC ...... *H03H 9/0576* (2013.01); *H03H 9/02897* (2013.01); *H03H 9/059* (2013.01); *H03H 9/1064* (2013.01); *H03H 9/1092* (2013.01)

(58) Field of Classification Search
CPC .. H03H 9/02897; H03H 9/0576; H03H 9/058; H03H 9/059; H03H 9/1064; H03H 9/1092; H03H 9/64; H03H 9/725

USPC .......................................... 333/133, 193–196
See application file for complete search history.

(56) References Cited

U.S. PATENT DOCUMENTS

| 5,831,369 | A * | 11/1998 | Furbacher | H03H 9/08 310/313 R |
|---|---|---|---|---|
| 6,710,682 | B2 * | 3/2004 | Onishi | H03H 9/02559 29/25.35 |
| 9,148,118 | B2 * | 9/2015 | Matsuda | H03H 9/1071 |
| 9,197,192 | B2 * | 11/2015 | Yamato | H03H 9/059 |
| 9,444,427 | B2 * | 9/2016 | Tsuda | H03H 9/14541 |
| 2012/0241211 | A1 * | 9/2012 | Inoue | H03H 9/1064 174/564 |
| 2012/0319802 | A1 * | 12/2012 | Ochiai | H03H 9/1092 333/193 |
| 2014/0003017 | A1 | 1/2014 | Kai et al. | |

(Continued)

FOREIGN PATENT DOCUMENTS

JP 5141852 B2 2/2013

*Primary Examiner* — Barbara Summons
(74) *Attorney, Agent, or Firm* — Keating & Bennett, LLP

(57) ABSTRACT

A surface acoustic wave device includes a piezoelectric substrate, an IDT electrode, support layers, and a cover layer. A distance from a first end of a first partition-support layer to one of the outer-periphery-frame support layers closest to the first end is smaller than a distance from a second end of the first partition-support layer to one of the outer-periphery-frame support layers closest to the second end, and a distance from a first end of a second partition-support layer to one of the outer-periphery-frame support layers closest to the first end is larger than a distance from a second end of the second partition-support layer to one of the outer-periphery-frame support layers closest to the second end.

18 Claims, 5 Drawing Sheets

(56) References Cited

U.S. PATENT DOCUMENTS

2015/0194948 A1* 7/2015 Inate .................. H03H 9/02913
333/133

* cited by examiner

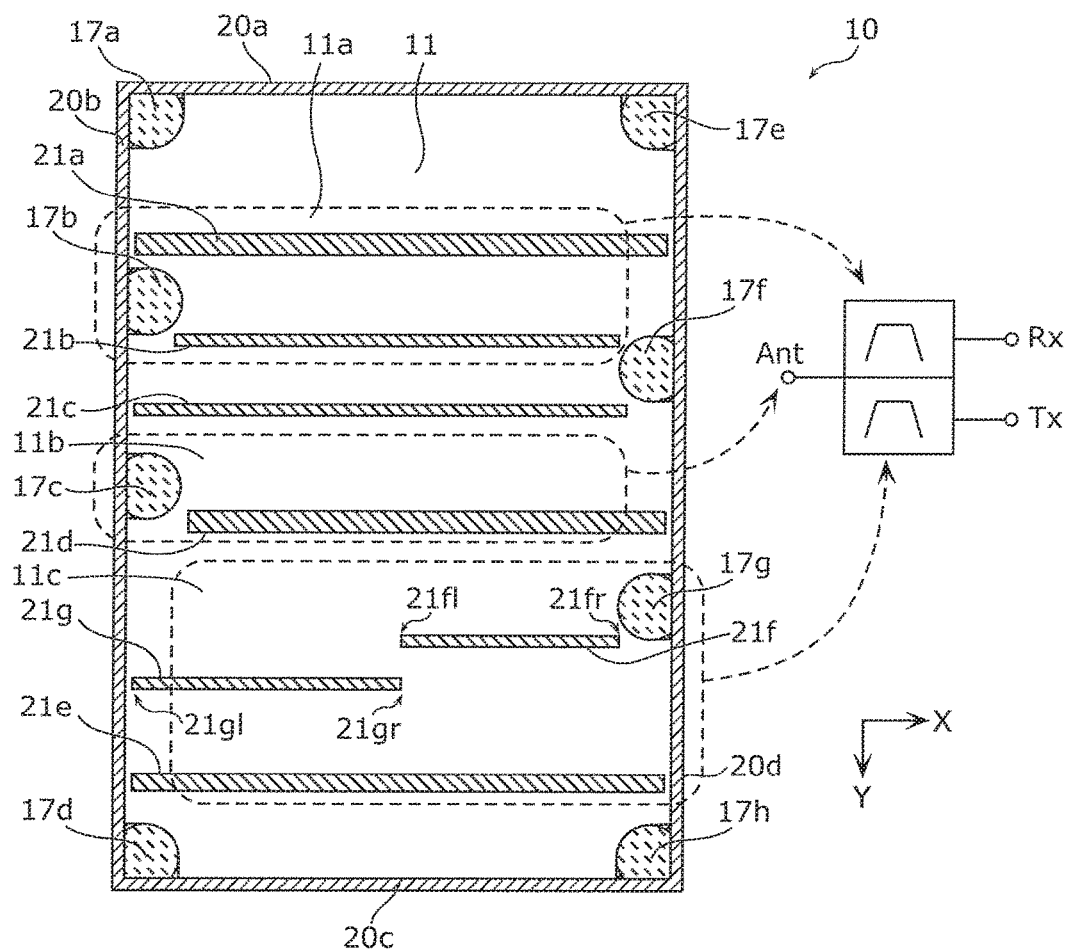

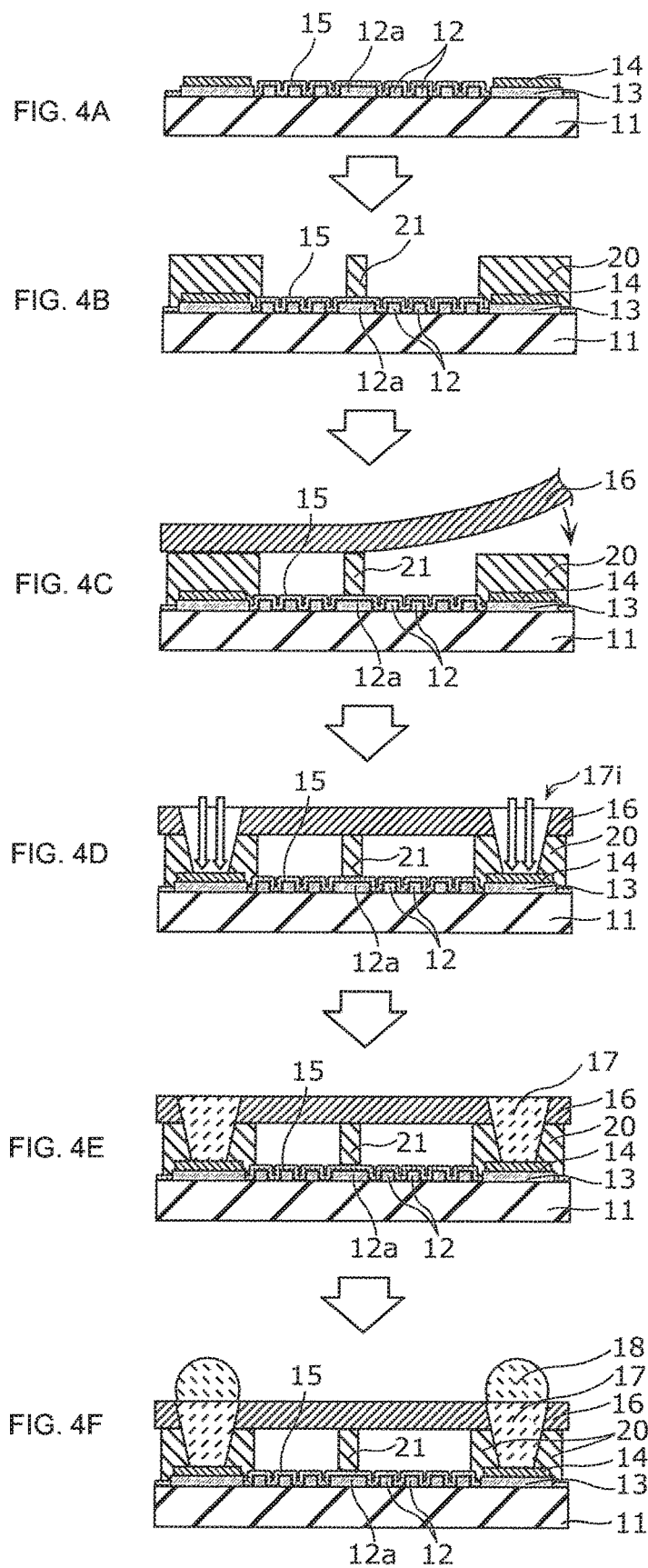

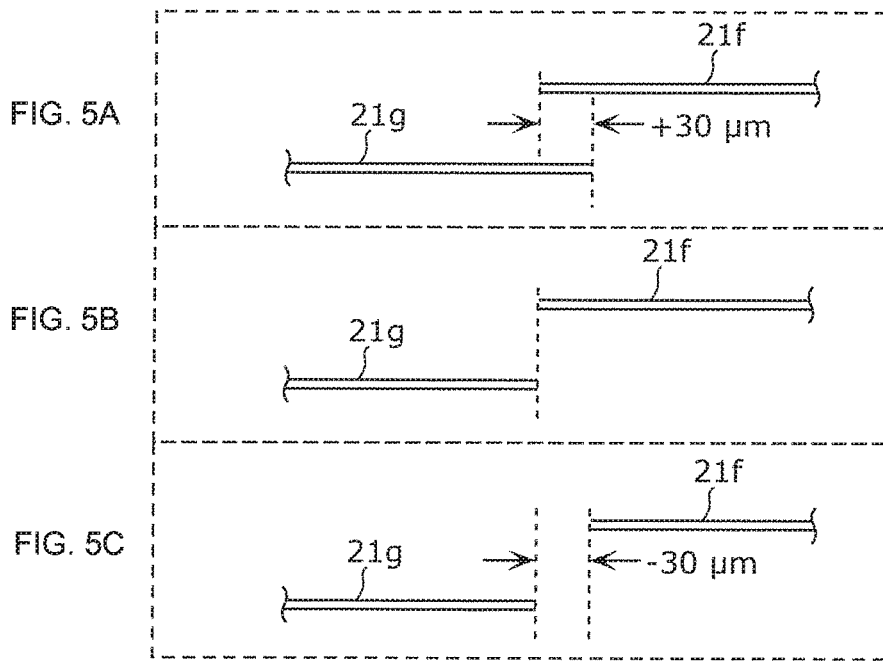
FIG. 5A
FIG. 5B
FIG. 5C
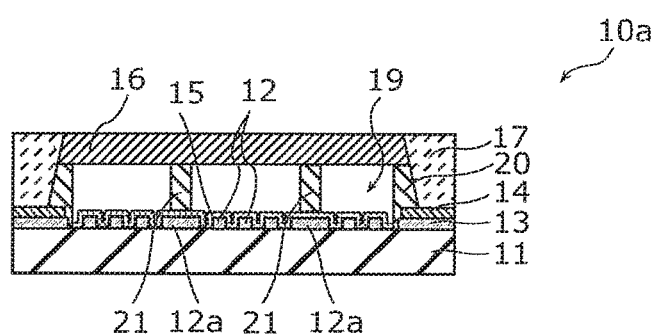
FIG. 6

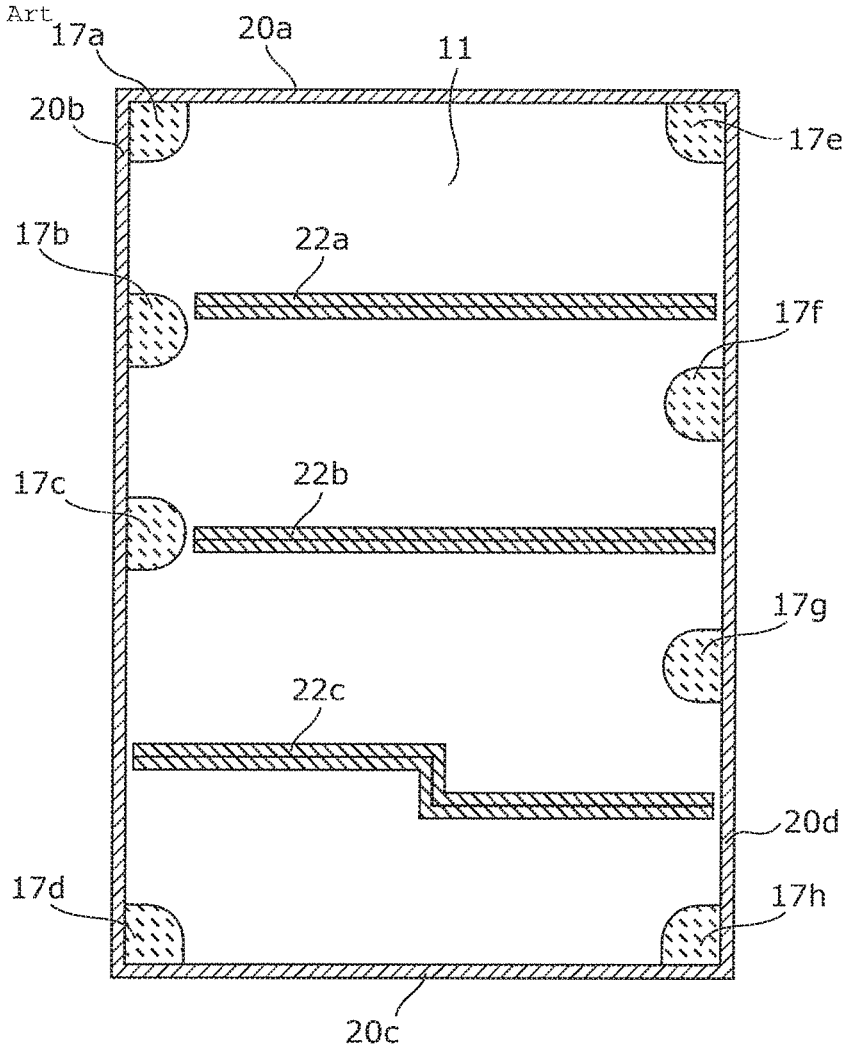

SURFACE ACOUSTIC WAVE DEVICE

CROSS REFERENCE TO RELATED APPLICATIONS

This application claims the benefit of priority to Japanese Patent Application No. 2015-252619 filed on Dec. 24, 2015. The entire contents of this application are hereby incorporated herein by reference.

BACKGROUND OF THE INVENTION

1. Field of the Invention

The present invention relates to surface acoustic wave devices, and more particularly, to a surface acoustic wave device having a wafer level package (WLP) structure.

2. Description of the Related Art

Surface acoustic wave devices are used as band pass filters in wireless sections, such as radio-frequency (RF) stages and intermediate-frequency (IF) stages, of mobile communication terminals. In recent years, wireless sections in personal digital assistants (PDAs), such as cellular phones and smartphones, have been modularized, and accordingly, there has been a need for a reduction in the size and height of surface acoustic wave devices. Thus, packaging technologies for surface acoustic wave devices have been improved, and a WLP technology has been proposed in which a chip of a surface acoustic wave device is directly used as a package. In a surface acoustic wave device, interdigital transducer (IDT) electrodes are provided on a piezoelectric substrate, and the surface acoustic wave device is packaged so that a hollow space is provided above the IDT electrodes. In a WLP-type surface acoustic wave device, a piezoelectric substrate is directly used as a package that includes a hollow space.

In modularization of wireless sections in PDAs, such as cellular phones and smartphones, there is a need to modularize such wireless sections by sealing them with a resin in order to protect them against external stress and moisture. When an entire module is sealed with a resin (e.g., transfer molding), high pressure is applied to individual components that are sealed with the resin, and accordingly, there is a need for a method for allowing a surface acoustic wave device having a hollow space inside thereof to be capable of withstanding such high pressure and to be capable of withstanding a mold resin that tries to enter the surface acoustic wave device (i.e., a method for allowing the surface acoustic wave device to have mold resistance or pressure resistance and to have a lamination property or a sealing property).

In the related art, as a technology that ensures the mold resistance and the lamination property of a surface acoustic wave device, a technology for providing a partition-support layer (inner support layer), which functions as a spacer, in a hollow space has been proposed (see, for example, Japanese Patent No. 5141852). In Japanese Patent No. 5141852, the mold resistance of a surface acoustic wave device is ensured by disposing a partition-support layer, which is made of a resin, at a center portion of a hollow space so as to be vertically arranged between a piezoelectric substrate and a cover layer that define the hollow space.

Here, in order to further improve the mold resistance, providing a partition-support layer, which extends in the lateral and longitudinal directions when the piezoelectric substrate is viewed in plan, in the hollow space may be considered. FIG. 7 is a layout view of a hollow space of a surface acoustic wave device according to a reference example (a diagram when a piezoelectric substrate is viewed in plan). FIG. 7 illustrates a piezoelectric substrate 11, on which IDT electrodes (not illustrated) have been provided, outer-periphery-frame support layers 20a to 20d which cover the periphery of the piezoelectric substrate 11, partition-support layers 22a to 22c, which are disposed so as to partition the hollow space, and columnar electrodes 17a to 17h. Each of the partition-support layers 22a to 22c is vertically arranged on the piezoelectric substrate 11 in a region in which the IDT electrodes are not disposed, and the partition-support layers 22a to 22c support, together with the outer-periphery-frame support layers 20a to 20d, a cover layer (not illustrated) that defines a ceiling of the hollow space. When the piezoelectric substrate 11 is viewed in plan, the partition-support layer 22c has a substantially crank shape extending so as to partition the hollow space in the longitudinal and lateral directions. As a result, reinforcement strength with respect to the cover layer may be enhanced, and the mold resistance of the surface acoustic wave device may be improved, whereas if all the partition-support layers 22a to 22c extend in only one direction, the reinforcement strength with respect to the cover layer would not be enhanced, and the mold resistance of the surface acoustic wave device would not be improved.

However, in the case where the partition-support layer 22c having a substantially crank shape, such as that illustrated in FIG. 7 is provided, when the cover layer, which is made of a resin, is attached to the outer-periphery-frame support layers 20a to 20d and the partition-support layers 22a to 22c from above, wrinkles are generated in a portion of the cover layer that is brought into contact with a crank portion of the partition-support layer 22c, and the partition-support layer 22c is embedded into the cover layer. As a result, the portion of the cover layer in contact with the crank portion of the partition-support layer 22c, is crushed. For example, when attaching a cover layer, which has been rolled, to the partition-support layer 22a, the partition-support layer 22b, and the partition-support layer 22c in this order while stretching the cover layer, when the cover layer is attached to the partition-support layer 22c, wrinkles are generated in the cover layer, and the cover layer is crushed. As a result, problems occur in that a portion having a reduced thickness is locally provided in the cover layer, or breakage occurs locally in the cover layer, so that the mold resistance and the lamination property of the surface acoustic wave device will not be ensured, and the reliability of the surface acoustic wave device will not be ensured as a result of the wrinkles, which have been generated in the cover layer, being in contact with the IDT electrodes or wiring electrodes.

SUMMARY OF THE INVENTION

Preferred embodiments of the present invention provide a surface acoustic wave device having a wafer level package (WLP) structure whose mold resistance, lamination property, and reliability are improved and ensured.

A surface acoustic wave device according to a preferred embodiment of the present invention includes a piezoelectric substrate, an interdigital transducer (IDT) electrode that is disposed on a main surface of the piezoelectric substrate and that excites a surface acoustic wave, support layers each of which is vertically arranged in a region of the main surface other than a region in which the IDT electrode is disposed and each of which has a height greater than a height of the IDT electrode, and a cover layer that is disposed on the support layers and that covers the IDT electrode with a hollow space interposed between the cover layer and the IDT electrode. The support layers include a plurality of outer-periphery-frame support layers that are vertically arranged on the main surface around a periphery of the region in which the IDT electrode is disposed and a plurality of partition-support layers each of which is vertically arranged in a region of the main surface, the region being surrounded by the outer-periphery-frame support layers, the plurality of partition-support layers extending so as to be straight or substantially straight in a first direction, which is parallel or substantially parallel to the main surface, and being arranged in a second direction, which is parallel or substantially parallel to the main surface and perpendicular to the first direction, when the piezoelectric substrate is viewed in plan. The plurality of partition-support layers include a first partition-support layer and a second partition-support layer that are adjacent to each other in the arrangement of the plurality of partition-support layers and that have a characteristic described below. While the piezoelectric substrate is viewed in plan, when an end of the first partition-support layer and an end of the second partition-support layer that are oriented in the first direction are referred to as first ends, and another end of the first partition-support layer and another end of the second partition-support layer that are oriented in a direction opposite to the first direction are referred to as second ends, a distance from the first end of the first partition-support layer to one of the outer-periphery-frame support layers that is closest to the first end of the first partition-support layer is smaller than a distance from the second end of the first partition-support layer to one of the outer-periphery-frame support layers that is closest to the second end of the first partition-support layer, and a distance from the first end of the second partition-support layer to one of the outer-periphery-frame support layers that is closest to the first end of the second partition-support layer is larger than a distance from the second end of the second partition-support layer to one of the outer-periphery-frame support layers that is closest to the second end of the second partition-support layer.

With this configuration, when the piezoelectric substrate is viewed in plan, the partition-support layers have a structure (first partition-support layer and second partition-support layer) that is obtained by removing only a longitudinal portion (portion extending in the second direction) of the crank portion from the partition-support layer according to the above-described reference example, which has a crank shape or a substantially crank shape. As a result, the plurality of partition-support layers extend in the same direction (first direction) while maintaining mold resistance the same or substantially the same as the mold resistance of the partition-support layer having a substantially crank shape. Thus, the probability of an occurrence of a problem in that, when the cover layer, which is made of a resin or other suitable material, is attached to the outer-periphery-frame support layers and the partition-support layers from above, wrinkles are generated in the cover layer, and one of the partition-support layers is embedded into the cover layer is reduced. This results in a reduction in the probability of a portion having a small thickness being provided locally in the cover layer, and the cover layer is attached to the outer-periphery-frame support layers and the partition-support layers from above while maintaining the uniform thickness of the cover layer, so that the mold resistance, the lamination property, and the reliability are ensured. In addition, since the longitudinal portion (portion extending in the second direction) of the crank portion is removed from the partition-support layer according to the reference example, which has a crank shape or a substantially crank shape, the region of the piezoelectric substrate 11 in which the IDT electrode is to be disposed (electrode-design area) is increased by an amount equal or substantially equal to the longitudinal portion.

In addition, when the piezoelectric substrate is viewed in plan, each of the first partition-support layer and the second partition-support layer does not need to have a long length so as to divide the hollow space into two spaces and may have a small length, and thus, the probability of the region of the piezoelectric substrate in which the IDT electrode is disposed becoming narrow is reduced.

When viewed from the second direction, a portion of the first partition-support layer and a portion of the second partition-support layer may preferably be superposed with each other. For example, the length of a region in which the portion of the first partition-support layer and the portion of the second partition-support layer may be superposed with each other in the first direction may preferably be about 30 μm or smaller, for example.

Accordingly, since the first partition-support layer and the second partition-support layer include the portions which are superposed with each other when viewed from the second direction, the mold resistance is further improved as compared to a case where the first partition-support layer and the second partition-support layer are not superposed with each other.

In addition, when viewed from the second direction, the first partition-support layer and the second partition-support layer may preferably be separated from each other by a predetermined distance in the first direction. For example, the predetermined distance may preferably be about 30 μm or smaller, for example.

Accordingly, since the first partition-support layer and the second partition-support layer are separated from each other by the predetermined distance when viewed from the second direction, a larger region of the piezoelectric substrate in which the IDT electrode is disposed is ensured as compared to a case where the first partition-support layer and the second partition-support layer are not separated from each other.

In various preferred embodiments of the present invention, a WLP-type surface acoustic wave device, whose mold resistance, lamination property, and reliability are further improved, is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a layout view of a hollow space of the surface acoustic wave device illustrated in FIG. 1.

FIGS. 4A to 4F are diagrams illustrating a process of manufacturing the surface acoustic wave device according to a preferred embodiment of the present invention.

FIGS. 5A to 5C are diagrams illustrating examples of the positional relationship between a first partition-support layer and a second partition-support layer that are included in the surface acoustic wave device according to a preferred embodiment of the present invention.

FIG. 6 is a cross-sectional view of a surface acoustic wave device according to a modification of a preferred embodiment of the present invention.

FIG. 7 is a layout view of a hollow space of a surface acoustic wave device according to a reference example.

DETAILED DESCRIPTION OF THE PREFERRED EMBODIMENTS

Preferred embodiments of the present invention will be described in detail below with reference to the drawings. Note that the preferred embodiments, which will be described below, are preferred specific examples of the present invention. Numerical values, shapes, materials, components, arrangement positions and connection configurations of the components, steps, the order of the steps, and other features that are described in the following preferred embodiments are examples and are not intended to limit the scope of the present invention.

Figure 1:
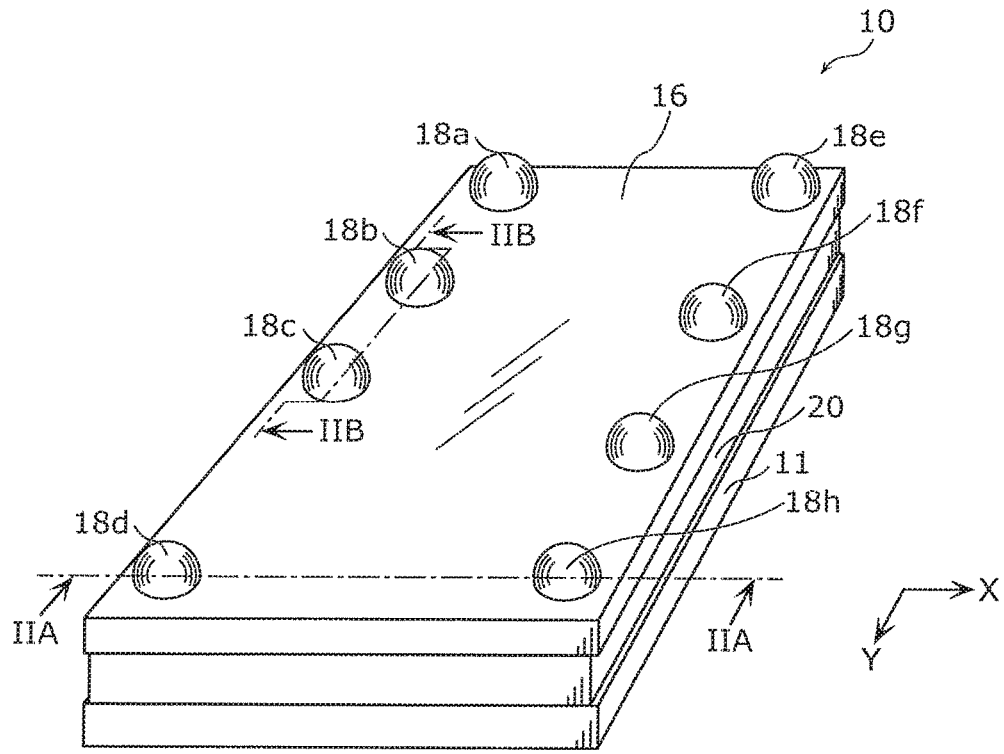
FIG. 1 is a diagram illustrating a surface acoustic wave device according to a preferred embodiment of the present invention.

FIG. 1 is a diagram illustrating a surface acoustic wave device 10 according to a preferred embodiment of the present invention. As viewed in FIG. 1, the right direction will be referred to as a first direction (positive X-axis direction), and a direction towards the front side and that is perpendicular to the first direction will be referred to as a second direction (positive Y-axis direction).

The surface acoustic wave device 10 has a wafer level package (WLP) structure and is preferably, for example, a transmission filter, a reception filter, a duplexer, or other suitable surface acoustic wave device. The surface acoustic wave device 10 includes a hollow space 19 inside thereof, and the hollow space 19 is surrounded by a piezoelectric substrate 11, an outer-periphery-frame support layer 20 that is disposed so as to be vertically arranged at an outer peripheral portion of the piezoelectric substrate 11, and a cover layer 16 that is disposed on the outer-periphery-frame support layer 20. When the piezoelectric substrate 11 is viewed in plan, the overall shape of the surface acoustic wave device 10 is preferably rectangular or substantially rectangular defined by the X-axis direction and the Y-axis direction. Solder bumps 18a to 18h are exposed upward at the cover layer 16. The surface acoustic wave device 10 is typically soldered to mounting substrate (not illustrated) while being turned upside down from the state illustrated in FIG. 1 with the solder bumps 18a to 18h interposed therebetween.

Figure 2A:
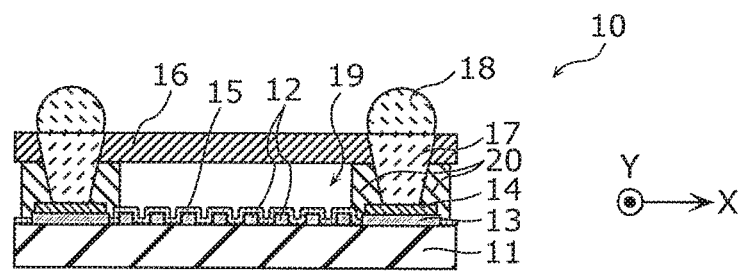
FIG. 2A is a cross-sectional view of the surface acoustic wave device obtained by cutting the surface acoustic wave device in a plane including line IIA-IIA of FIG. 1.
Figure 2B:
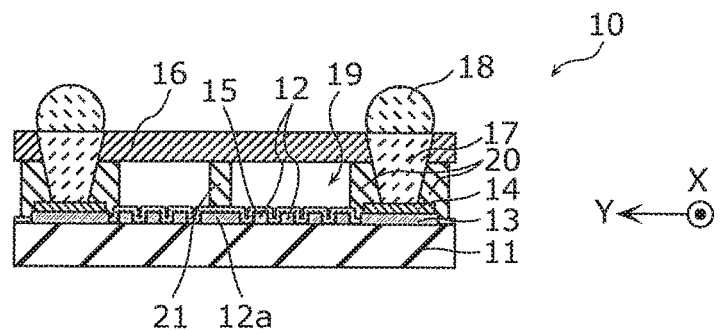
FIG. 2B is a cross-sectional view of the surface acoustic wave device obtained by cutting the surface acoustic wave device in a plane including line IIB-IIB of FIG. 1.

FIG. 2A is a cross-sectional view of the surface acoustic wave device 10 obtained by cutting the surface acoustic wave device in a plane including line IIA-IIA of FIG. 1. FIG. 2B is a cross-sectional view of the surface acoustic wave device 10 obtained by cutting the surface acoustic wave device in a plane including line IIB-IIB of FIG. 1.

The surface acoustic wave device 10 includes the piezoelectric substrate 11, IDT electrodes 12, wiring patterns 12a, terminal electrodes 13, wiring electrodes 14, a protective film 15, the cover layer 16, columnar electrodes 17, solder bumps 18, the outer-periphery-frame support layer 20, and partition-support layers 21.

Preferably, the piezoelectric substrate 11 is a piezoelectric body that defines a substrate of the surface acoustic wave device 10 and is made of, for example, a piezoelectric single crystal, such as lithium tantalate ($LiTaO_3$), lithium niobate ($LiNbO_3$), or quartz crystal, or a piezoelectric ceramic.

Each of the IDT electrodes 12 is a pair of comb-shaped or substantially comb-shaped electrodes that is disposed on a main surface (top surface) of the piezoelectric substrate 11 and that excites a surface acoustic wave. For example, each of the IDT electrodes 12 is preferably made of a metal, such as Ti, Al, Cu, Au, Pt, Ag, Pd, or Ni, or an alloy, or is defined by a multilayer body including at least one of the above-mentioned metals or an alloy.

The wiring patterns 12a are conductive patterns that connect the plurality of IDT electrodes 12 and connect the IDT electrodes 12 and the terminal electrodes 13 to one another, and the wiring patterns 12a are preferably made of, for example, a material similar to that of the IDT electrodes 12.

The terminal electrodes 13 are electrodes that are connected to the IDT electrodes 12 and are each disposed at an outer peripheral portion of the main surface of the piezoelectric substrate 11, and the terminal electrodes 13 are preferably made of, for example, a material similar to that of the IDT electrodes 12.

The wiring electrodes 14 are electrodes that are disposed on the terminal electrodes 13 and that define portions of a wiring path connecting the IDT electrodes 12 and the outside of the surface acoustic wave device 10 to each other, and the wiring electrodes 14 are preferably made of, for example, a material similar to that of the IDT electrodes 12.

The protective film 15 is a layer that covers the IDT electrodes 12 in order to protect the IDT electrodes 12 and is preferably made of, for example, a dielectric material, such as silicon oxide or silicon nitride.

The outer-periphery-frame support layer 20 is vertically arranged in a region of the main surface of the piezoelectric substrate 11 other than a region in which the IDT electrodes 12 have been disposed. The outer-periphery-frame support layer 20 is one of support layers, each of which has a height larger than the height of each of the IDT electrodes 12, and is vertically arranged around the periphery of the region in which the IDT electrodes 12 have been disposed. The outer-periphery-frame support layer 20 is preferably made of, for example, a material including at least one of a polyimide, an epoxy resin, benzocyclobutene (BCB), polybenzoxazole (PBC)), a metal, and silicon oxide. Note that, although the outer-periphery-frame support layer 20 is vertically arranged on the protective film 15 in the present preferred embodiment, the outer-periphery-frame support layer 20 may be vertically arranged directly on the piezoelectric substrate 11 or may be vertically arranged on the wiring patterns 12a that is provided on the piezoelectric substrate 11.

Each of the partition-support layers 21 is vertically arranged in a region of the main surface of the piezoelectric substrate 11 other than the region in which the IDT electrodes 12 are disposed. Each of the partition-support layers 21 is one of the support layers, each of which has a height larger than the height of each of the IDT electrodes 12, and is vertically arranged in a region surrounded by the outer-periphery-frame support layer 20. Each of the partition-support layers 21 is preferably made of, for example, a material similar to that of the outer-periphery-frame support layer 20. Note that, although the partition-support layers 21 are vertically arranged on the protective film 15, which covers the wiring patterns 12a, in the present preferred embodiment, the partition-support layers 21 may be vertically arranged directly on the wiring patterns 12a without the protective film 15 interposed therebetween or may be vertically arranged directly on the piezoelectric substrate 11.

The cover layer 16 is a layer that is disposed on the support layers (outer-periphery-frame support layer 20 and partition-support layers 21) and that covers the IDT electrodes 12 with the hollow space 19 interposed therebetween and preferably has a multilayer structure including a lower layer that is made of for example, a material including at least one of an epoxy resin, urethane, phenol, a polyester, BCB, and PBO and an upper layer that is made of for example, a material including at least one of a polyimide, an epoxy resin, BCB, PBO, silicon, a silicon oxide, $LiTaO_3$, and $LiNbO_3$.

The columnar electrodes 17 are electrodes that define portions of a wiring path connecting the wiring electrodes 14 and the outside to each other and that extend through the outer-periphery-frame support layer 20 and the cover layer 16, and the columnar electrodes 17 are preferably made of, for example, a material similar to that of the IDT electrodes 12.

The solder bumps 18 are connecting electrodes each having a protruding shape that are used to solder the surface acoustic wave device 10 to the mounting substrate (not illustrated), and the solder bumps 18 are preferably made of, for example, a material similar to that of the IDT electrodes 12 or solder.

FIG. 3 is a layout view of the hollow space 19 of the surface acoustic wave device 10 illustrated in FIG. 1. Here, in order to simplify FIG. 3, the IDT electrodes 12 and other elements are not illustrated, and FIG. 3 illustrates only the piezoelectric substrate on which the IDT electrodes 12 are provided, the outer-periphery-frame support layers 20a to 20d covering the periphery of the piezoelectric substrate 11, the partition-support layers 21a to 21g that partition the hollow space 19, and the columnar electrodes 17a to 17h.

The outer-periphery-frame support layers 20a to 20d are components of the outer-periphery-frame support layer 20 illustrated in FIG. 1 and define a rectangular or substantially rectangular shape surrounding the region of the main surface of the piezoelectric substrate 11 in which the IDT electrodes 12 are disposed. Note that regions 11a to 11c of the main surface of the piezoelectric substrate 11, each of which is surrounded by one of three dashed line frames in FIG. 3, respectively correspond to a reception filter, an intermediate region positioned between the reception filter and a transmission filter, and the transmission filter where the surface acoustic wave device 10 is a duplexer, for example.

The partition-support layers 21a to 21g are specific examples corresponding to the partition-support layers 21 illustrated in FIG. 2B and are vertically arranged in the region of the main surface of the piezoelectric substrate 11 surrounded by the outer-periphery-frame support layer 20. The partition-support layers 21a to 21g are a plurality of partition-support layers, and when the piezoelectric substrate 11 is viewed in plan, the plurality of partition-support layers extend so as to be straight or substantially straight in the first direction (positive X-axis direction), which is parallel or substantially parallel to the main surface of the piezoelectric substrate 11, and are arranged in the second direction (positive Y-axis direction), which is parallel or substantially parallel to the main surface of the piezoelectric substrate 11 and which is perpendicular to the first direction (positive X-axis direction). In other words, the partition-support layers 21a to 21g extend so as to be straight or substantially straight in the first direction (positive X-axis direction). That is to say, only partition-support layers that are parallel or substantially parallel to one another are provided as the partition-support layers 21a to 21g.

However, preferably, the partition-support layers 21a to 21g are not arranged at an equal pitch in the Y-axis direction and do not have the same width in the Y-axis direction. For example, among the gaps between adjacent ones of the partition-support layers 21a to 21g, the gap between the partition-support layer 21c and the partition-support layer 21d is the largest, and the gap between the first partition-support layer 21f and the second partition-support layer 21g is the smallest. Regarding the widths of the partition-support layers 21a to 21g, for example, the widths of the partition-support layer 21a and the partition-support layer 21d are preferably equal or substantially equal to each other and are the largest, and the widths of the partition-support layer 21b, the partition-support layer 21c, the first partition-support layer 21f, and the second partition-support layer 21g are preferably equal or substantially equal to one another and are the smallest. The widths of the partition-support layers 21a to 21g are set while being limited by the size and the position of a region in which the IDT electrodes 12 are not disposed and, for example, to distribute reinforcement strength, which corresponds to the mold resistance, in the hollow space 19 as uniformly as possible.

In the present preferred embodiment, the partition-support layers 21a to 21g preferably do not extend to (are not in contact with) the outer-periphery-frame support layers 20a to 20d in order to make the internal pressure of the hollow space 19 uniform or substantially uniform by maintaining the hollow space 19 as a single space.

Here, a characteristic configuration of the present preferred embodiment is that the plurality of partition-support layers 21a to 21g include the first partition-support layer 21f and the second partition-support layer 21g that are adjacent to each other in the arrangement of the plurality of partition-support layers 21a to 21g and that have characteristics described below.

While the piezoelectric substrate 11 is viewed in plan, when an end of the first partition-support layer 21f and an end of the second partition-support layer 21g on the first direction (positive X-axis direction) side are respectively referred to as first ends 21fr and 21gr, and an end of the first partition-support layer 21f and an end of the second partition-support layer 21g on a direction (negative X-axis direction) side, the direction being opposite to the first direction, are respectively referred to as second ends 21fl and 21gl, the following two relationships are satisfied.

(1) The distance from the first end 21fr of the first partition-support layer 21f to the outer-periphery-frame support layer 20d, which is closest to the first end 21fr, is smaller than the distance from the second end 21fl of the first partition-support layer 21f to the outer-periphery-frame support layer 20b, which is closest to the second end 21fl.

(2) The distance from the first end 21gr of the second partition-support layer 21g to the outer-periphery-frame support layer 20d, which is closest to the first end 21gr, is larger than the distance from the second end 21gl of the second partition-support layer 21g to the outer-periphery-frame support layer 20b, which is closest to the second end 21gl.

The above two relationships indicate that the first partition-support layer 21f and the second partition-support layer 21g have a structure that is obtained by removing only a longitudinal portion (portion extending in the Y-axis direction) of the crank portion from the partition-support layer 22c according to the above-described reference example, which has a crank shape or a substantially crank shape, (the first partition-support layer 21f and the second partition-support layer 21g are arranged so as to be offset with respect to each other). As a result, the plurality of partition-support layers 21a to 21g extend in the same or substantially the same direction (first direction) while maintaining mold resistance at the same or substantially the same mold resistance of the partition-support layer 22c having a crank shape or a substantially crank shape. Therefore, the probability of occurrence of a problem in that, when the cover layer 16, which is made of a resin or other suitable material, is attached to the outer-periphery-frame support layers 20a to 20d and the partition-support layers 21a to 21g from above, wrinkles are generated in the cover layer 16, and one of the partition-support layers is embedded into the cover layer 16 is reduced. This results in a reduction in the probability of a portion having a small thickness being provided locally in the cover layer 16, and the cover layer 16 is attached to the outer-periphery-frame support layers 20a to 20d and the partition-support layers 21a to 21g from above while maintaining the uniform thickness of the cover layer 16, so that the mold resistance, the lamination property, and the reliability are ensured. In addition, since the longitudinal portion (portion extending in the second direction) of the crank portion is removed from the partition-support layer 22c according to the reference example, which has a crank shape or a substantially crank shape, the region of the piezoelectric substrate 11 in which the IDT electrodes 12 are to be disposed (electrode-design area) is increased by an amount equal or substantially equal to the longitudinal portion.

In addition, when the piezoelectric substrate 11 is viewed in plan, each of the first partition-support layer 21f and the second partition-support layer 21g does not need to have a long length so as to divide the hollow space 19 into two spaces and may have a small length (preferably a length half or approximately half of the length of the hollow space 19 in the X-axis direction in the present preferred embodiment), and thus, the probability of the region of the piezoelectric substrate 11 in which the IDT electrodes 12 are disposed becoming narrow is reduced.

FIGS. 4A to 4F are diagrams illustrating a non-limiting example of a process of manufacturing the surface acoustic wave device 10 according to a preferred embodiment of the present invention.

First, as illustrated in FIG. 4A, after the IDT electrodes 12, the wiring patterns 12a, and the terminal electrodes 13 have been formed on the main surface of the piezoelectric substrate 11 by a vacuum deposition method or other suitable method using a photolithography technique, for example, the wiring electrodes 14 are formed on the terminal electrodes 13 by a method similar to the above-described method. Then, the protective film 15, which covers the main surface of the piezoelectric substrate 11, the IDT electrodes 12, and the wiring patterns 12a, is formed by sputtering or other suitable method using a photolithography technique.

Next, as illustrated in FIG. 4B, the support layers (outer-periphery-frame support layer 20 and partition-support layers 21) are formed into films using a photolithography technique so as to be vertically arranged in a region of the main surface of the piezoelectric substrate 11 other than the region in which the IDT electrodes 12 are disposed. In this case, the film deposition process for the support layers continues until the height of each of the support layers is larger than the height of each of the IDT electrodes 12.

Next, as illustrated in FIG. 4C, the cover layer 16, which has been rolled, is attached to the support layers (outer-periphery-frame support layer 20 and partition-support layers 21) from above and is fixed onto the support layers by being pressed against the support layers. For example, in the structure illustrated in FIG. 3, the cover layer 16 is preferably attached to and fixed onto the outer-periphery-frame support layer 20a, the partition-support layer 21a, the partition-support layer 21b, the partition-support layer 21c, the partition-support layer 21d, the first partition-support layer 21f, the second partition-support layer 21g, the partition-support layer 21e, and the outer-periphery-frame support layer 20c so as to be in contact with these layers by being pressed against the layers in the second direction. Here, when the cover layer 16 is attached to the first partition-support layer 21f and the second partition-support layer 21g, since the first partition-support layer 21f and the second partition-support layer 21g have a structure obtained by removing only the longitudinal portion (portion extending in the Y-axis direction) of the crank portion from the partition-support layer 22c according to the reference example, which has a crank shape or a substantially crank shape, (the first partition-support layer 21f and the second partition-support layer 21g are arranged so as to be offset with respect to each other), the probability of the occurrence of a problem in that wrinkles are generated in the cover layer 16 and that one of the partition-support layers is embedded into the cover layer 16 is significantly reduced.

Next, as illustrated in FIG. 4D, through holes 17i are formed by removing portions of the cover layer 16 and portions of the outer-periphery-frame support layer 20 by, for example, radiating a laser beam onto the cover layer 16 and the outer-periphery-frame support layer 20, and the wiring electrodes 14 are exposed.

Next, as illustrated in FIG. 4E, the columnar electrodes 17 with which the through holes 17i are filled are formed by, for example, performing electrolytic plating.

Finally, as illustrated in FIG. 4F, the solder bumps 18 are bonded to the columnar electrodes 17 by, for example, being pressed against the columnar electrodes 17.

Note that, the above-described process is performed on a base material of the piezoelectric substrate 11 in order to manufacture a plurality of surface acoustic wave devices 10 at the same time, and at the end of the process, the surface acoustic wave devices 10 are isolated from one another by, for example, cutting with a dicing machine the surface acoustic wave devices 10 into individual devices.

The WLP-type surface acoustic wave device 10 according to the present preferred embodiment preferably is manufactured through a process, such as the non-limiting example of a manufacturing method described above.

The surface acoustic wave device 10 according to the present preferred embodiment manufactured in the manner described above has the following characteristics. The surface acoustic wave device 10 includes the piezoelectric substrate 11, the IDT electrodes 12, each of which is disposed on the main surface of the piezoelectric substrate 11 and each of which excites a surface acoustic wave, the support layers (outer-periphery-frame support layer 20 and partition-support layers 21), each of which is vertically arranged in a region of the main surface of the piezoelectric substrate 11 other than the region in which the IDT electrodes 12 are disposed, and each of which has a height larger than the height of each of the IDT electrodes 12, and the cover layer 16, which is disposed on the support layers and which covers the IDT electrodes 12 with the hollow space 19 interposed therebetween. The support layers include the outer-periphery-frame support layers 20a to 20d, which are vertically arranged around the periphery of the region of the main surface of the piezoelectric substrate 11 in which the IDT electrodes 12 are disposed, and the plurality of partition-support layers 21a to 21g that are vertically arranged in the region of the main surface of the piezoelectric substrate 11, the region being surrounded by the outer-periphery-frame support layers 20a to 20d, the plurality of partition-support layers 21a to 21g extending, when the piezoelectric substrate 11 is viewed in plan, so as to be straight or substantially straight in the first direction (positive X-axis direction), which is parallel or substantially parallel to the main surface of the piezoelectric substrate 11, and being arranged in the second direction (positive Y-axis direction), which is parallel or substantially parallel to the main surface of the piezoelectric substrate 11 and which is perpendicular or substantially perpendicular to the first direction (positive X-axis direction). The plurality of partition-support layers 21a to 21g include the first partition-support layer 21f and the second partition-support layer 21g, which are adjacent to each other in the arrangement of the plurality of partition-support layers 21a to 21g and which have the characteristics described below. While the piezoelectric substrate 11 is viewed in plan, when the end of the first partition-support layer 21f and the end of the second partition-support layer 21g oriented in the first direction (positive X-axis direction) are respectively referred to as the first ends 21fr and 21gr, and the end of the first partition-support layer 21f and the end of the second partition-support layer 21g oriented in the direction opposite to the first direction (positive X-axis direction) are respectively referred to as the second ends 21fl and 21g1, (1) the distance from the first end 21fr of the first partition-support layer 21f to the outer-periphery-frame support layer 20d, which is closest to the first end 21fr, is smaller than the distance from the second end 21fl of the first partition-support layer 21f to the outer-periphery-frame support layer 20b, which is closest to the second end 21fl, and (2) the distance from the first end 21gr of the second partition-support layer 21g to the outer-periphery-frame support layer 20d, which is closest to the first end 21gr, is larger than the distance from the second end 21g1 of the second partition-support layer 21g to the outer-periphery-frame support layer 20b, which is closest to the second end 21g1.

Accordingly, the first partition-support layer 21f and the second partition-support layer 21g have a structure, which is obtained by removing only the longitudinal portion (portion extending in the Y-axis direction) of the crank portion from the partition-support layer 22c according to the reference example, which has a crank shape or a substantially crank shape, (the first partition-support layer 21f and the second partition-support layer 21g are offset with respect to each other), and thus, the plurality of partition-support layers 21a to 21g extend in the same direction (first direction) while maintaining a mold resistance the same or substantially the same as the mold resistance of the partition-support layer 22c having a crank shape or a substantially crank shape. Therefore, the probability of the occurrence of the problem in that, when the cover layer 16, which is made of a resin or other suitable material, is attached to the outer-periphery-frame support layers 20a to 20d and the partition-support layers 21a to 21g from above, wrinkles are generated in the cover layer 16, and that one of the partition-support layers is embedded into the cover layer 16 is reduced. This results in a reduction in the probability of a portion having a small thickness being provided locally in the cover layer 16. In addition, the cover layer 16 is attached to the outer-periphery-frame support layers 20a to 20d and the partition-support layers 21a to 21g from above while maintaining the uniform thickness of the cover layer 16, and the mold resistance, the lamination property, and the reliability are ensured during a sealing operation using a resin, such as transfer molding. Furthermore, since the longitudinal portion (portion extending in the second direction) of the crank portion is removed from the partition-support layer 22c according to the reference example, which has a crank shape or a substantially crank shape, the region of the piezoelectric substrate 11 in which the IDT electrodes 12 are disposed (electrode-design area) is increased by an amount equal or substantially equal to the longitudinal portion.

When the piezoelectric substrate 11 is viewed in plan, each of the first partition-support layer 21f and the second partition-support layer 21g does not need to have a long length so as to divide the hollow space 19 into two spaces and may have a small length (preferably a length approximately half of the length of the hollow space 19 in the X-axis direction in the present preferred embodiment), and thus, the probability of the region of the piezoelectric substrate 11 in which the IDT electrodes 12 are disposed becoming narrow is reduced.

Note that, in the layout illustrated in FIG. 3, although the second end 21fl of the first partition-support layer 21f and the first end 21gr of the second partition-support layer 21g extend to the same or substantially the same position in the X-axis direction when viewed from the second direction (positive Y-axis direction), the positional relationship between the first partition-support layer 21f and the second partition-support layer 21g in the first direction (positive X-axis direction) is not limited to this relationship.

FIGS. 5A-5C is a diagram illustrating examples of the positional relationship between the first partition-support layer 21f and the second partition-support layer 21g, which are included in the surface acoustic wave device 10 according to a present preferred embodiment.

In FIG. 5A, when viewed from the second direction (positive Y-axis direction), a portion of the first partition-support layer 21f and a portion of the second partition-support layer 21g are preferably superposed with each other in the X-axis direction. Accordingly, since the first partition-support layer 21f and the second partition-support layer 21g include the portions which are superposed with each other in the X-axis direction when viewed from the second direction (positive Y-axis direction), the mold resistance is further improved as compared to a case where the first partition-support layer 21f and the second partition-support layer 21g do not include portions that are superposed with each other.

Note that it is preferable that the length (superposed width) of a region in which the portion of the first partition-support layer 21f and the portion of the second partition-support layer 21g are superposed with each other in the first direction (positive X-axis direction) be about 30 µm or smaller, for example. This is because, if the region in which the portion of the first partition-support layer 21f and the portion of the second partition-support layer 21g are superposed with each other is too large, the region of the piezoelectric substrate 11 in which the IDT electrodes 12 are disposed would be reduced.

In FIG. 5B, when viewed from the second direction (positive Y-axis direction), preferably, the first partition-support layer 21f and the second partition-support layer 21g extend such that the second end 21fl of the first partition-support layer 21f and the first end 21gr of the second partition-support layer 21g are located at the same or substantially the same position in the X-axis direction. This layout is the same as that illustrated in FIG. 3.

In FIG. 5C, when viewed from the second direction (positive Y-axis direction), preferably, the first partition-support layer 21f and the second partition-support layer 21g are separated from each other by a predetermined distance in the X-axis direction. Accordingly, since the first partition-support layer 21f and the second partition-support layer 21g are separated from each other by the predetermined distance in the X-axis direction when viewed from the second direction (positive Y-axis direction), a larger region of the piezoelectric substrate 11 in which the IDT electrodes 12 are disposed is ensured compared with the case where the first partition-support layer 21f and the second partition-support layer 21g are not separated from each other.

Note that it is preferable that the predetermined distance be about 30 μm or smaller, for example. This is because, if the predetermined distance is too large, the mold resistance would not be ensured.

Note that the surface acoustic wave device according to the present invention is not limited to the structure described in the preferred embodiment described above and may include the columnar electrodes 17 that are exposed. FIG. 6 is a cross-sectional view of a surface acoustic wave device 10a according to a modification of a preferred embodiment of the present invention. In the surface acoustic wave device 10a, the columnar electrodes 17 are exposed, and solder bumps are not provided on the columnar electrodes 17. Advantageous effects similar to those of the above-described preferred embodiment are able to be obtained by providing a first partition-support layer 21f and a second partition-support layer 21g, which are similar to those of the above-described preferred embodiment, in the surface acoustic wave device 10a. In the surface acoustic wave device 10a, since the outer-periphery-frame support layer 20 and the cover layer 16 are not disposed on exposed portions of the columnar electrodes 17, a reduction in the size of the surface acoustic wave device 10a is able to be achieved. In addition, since solder bumps are not provided on the columnar electrodes 17, a further reduction in the height of the surface acoustic wave device 10a is able to be achieved. Furthermore, when mounting the surface acoustic wave device 10a, the surface acoustic wave device 10a is able to be connected to a mounting substrate not only via top surfaces of the columnar electrodes 17 but also via side surfaces of the columnar electrodes 17, and thus, the mounting strength of the surface acoustic wave device 10a is able to be improved.

Although surface acoustic wave devices according to the present invention have been described with reference to preferred embodiments and modifications thereof, the present invention is not limited thereto. Other preferred embodiments obtained by making various modifications devised by those skilled in the art to the preferred embodiments and the modifications or obtained by combining some of the components in the preferred embodiments and the modifications are also included in the scope of the present invention.

For example, in the above-described preferred embodiments, although only one pair of the first partition-support layer 21f and the second partition-support layer 21g, which have the above-described characteristics (1) and (2), preferably are provided in the surface acoustic wave device 10 as illustrated in FIG. 3, two or more pairs of the first partition-support layer 21f and the second partition-support layer 21g may be provided.

In the above-described preferred embodiments, although the first partition-support layer 21f and the second partition-support layer 21g are preferably arranged in this order in the second direction (positive Y-axis direction), these layers may be arranged in reverse order (in the order of the second partition-support layer 21g and the first partition-support layer 21f).

In the above-described preferred embodiments, although the first partition-support layer 21f and the second partition-support layer 21g preferably are positioned in the region 11c, in which the transmission filter is provided, the positions of the layers are not limited to these positions, and the first partition-support layer 21f and the second partition-support layer 21g may be positioned in the region 11a, in which the reception filter is provided, or in the region 11b, which corresponds to the intermediate region.

In the above-described preferred embodiments, although the first partition-support layer 21f and the second partition-support layer 21g preferably extend from a position near the outer-periphery-frame support layer 20 to the center or substantially the center of the hollow space 19 in the X-axis direction, the first partition-support layer 21f and the second partition-support layer 21g are not limited to this arrangement. Each of the first partition-support layer 21f and the second partition-support layer 21g may extend to a position that is closer to the outer-periphery-frame support layer 20 than to the center of the hollow space 19 in the X-axis direction (e.g., a position that is spaced apart from the outer-periphery-frame support layer 20 by an amount equal to approximately one fourth of the size of the hollow space 19 in the X-axis direction).

In the above-described preferred embodiments, although the partition-support layers 21a to 21g preferably are arranged so as not to extend to (so as not to be in contact with) the outer-periphery-frame support layers 20a to 20d, the present invention is not limited to this configuration. A first end and/or a second end of at least one of the partition-support layers 21a to 21g may extend to (may be in contact with) the outer-periphery-frame support layers 20a to 20d.

In the above-described preferred embodiments, although FIG. 3 illustrates the layout of the partition-support layers 21a to 21g in the case where the surface acoustic wave device 10 is a duplexer, the surface acoustic wave device 10 is not limited to a duplexer and may be any type of filter as long as the filter is a WLP-type SAW device.

Preferred embodiments of the present invention can be applied to WLP-type surface acoustic wave devices, and more particularly, to a surface acoustic wave device whose mold resistance, lamination property, and reliability are favorable (e.g., a surface acoustic wave device that is included in a wireless module in a PDA).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
   a piezoelectric substrate;
   an interdigital transducer electrode that is disposed on a main surface of the piezoelectric substrate and that excites a surface acoustic wave;
   support layers each of which is vertically arranged in a region of the main surface of the piezoelectric substrate other than a region in which the interdigital transducer electrode is disposed, and each of the support layers has a height larger than a height of the interdigital transducer electrode; and
   a cover layer that is disposed on the support layers and that covers the interdigital transducer electrode with a hollow space interposed between the cover layer and the interdigital transducer electrode; wherein
   the support layers include:
      a plurality of outer-periphery-frame support layers that are vertically arranged on the main surface of the piezoelectric substrate around a periphery of the region in which the interdigital transducer electrode is disposed; and a plurality of partition-support layers each of which is vertically arranged in a region of the main surface, the region being surrounded by the outer-periphery-frame support layers, the plurality of partition-support layers extending, when the piezoelectric substrate is viewed in plan, straight or substantially straight in a first direction, which is parallel or substantially parallel to the main surface, and being arranged in a second direction parallel or substantially parallel to the main surface and perpendicular or substantially perpendicular to the first direction; and the plurality of partition-support layers include a first partition-support layer and a second partition-support layer that are adjacent to each other in an arrangement of the plurality of partition-support layers and that have a characteristic described below:

when the piezoelectric substrate is viewed in plan, where an end of the first partition-support layer and an end of the second partition-support layer that are oriented in the first direction are referred to as first ends, and another end of the first partition-support layer and another end of the second partition-support layer that are oriented in a direction opposite to the first direction are referred to as second ends, a distance from the first end of the first partition-support layer to one of the outer-periphery-frame support layers that is closest to the first end of the first partition-support layer is smaller than a distance from the second end of the first partition-support layer to one of the outer-periphery-frame support layers that is closest to the second end of the first partition-support layer, and a distance from the first end of the second partition-support layer to one of the outer-periphery-frame support layers that is closest to the first end of the second partition-support layer is larger than a distance from the second end of the second partition-support layer to one of the outer-periphery-frame support layers that is closest to the second end of the second partition-support layer.

2. The surface acoustic wave device according to claim 1, wherein a portion of the first partition-support layer and a portion of the second partition-support layer are superposed with each other when viewed from the second direction.

3. The surface acoustic wave device according to claim 2, wherein a region in which the portion of the first partition-support layer and the portion of the second partition-support layer are superposed with each other has a length of about 30 μm or smaller in the first direction.

4. The surface acoustic wave device according to claim 1, wherein the first partition-support layer and the second partition-support layer are separated from each other by a predetermined distance in the first direction when viewed from the second direction.

5. The surface acoustic wave device according to claim 4, wherein the predetermined distance is about 30 μm or smaller.

6. The surface acoustic wave device according to claim 1, further comprising solder bumps exposed at an outer surface of the cover layer.

7. The surface acoustic wave device according to claim 1, wherein the interdigital electrode defines a transmission filter.

8. The surface acoustic wave device according to claim 1, wherein the interdigital electrode defines a reception filter.

9. The surface acoustic wave device according to claim 1, wherein the interdigital electrode defines a duplexer.

10. The surface acoustic wave device according to claim 1, wherein the piezoelectric substrate is made of a piezoelectric single crystal.

11. The surface acoustic wave device according to claim 10, wherein the piezoelectric single crystal is one of lithium tantalate, lithium niobate, and quartz crystal.

12. The surface acoustic wave device according to claim 1, wherein the interdigital electrode is made of Ti, Al, Cu, Au, Pt, Ag, Pd, or Ni, or an alloy thereof.

13. The surface acoustic wave device according to claim 1, wherein the interdigital electrode is covered by a protective film made of a dielectric material.

14. The surface acoustic wave device according to claim 1, wherein the support layers are made of a material including at least one of a polyimide, an epoxy resin, benzocyclobutene, polybenzoxazole, a metal, and silicon oxide.

15. The surface acoustic wave device according to claim 1, wherein the plurality of partition-support layers do not extend to any of the outer-periphery-frame support layers.

16. The surface acoustic wave device according to claim 1, wherein the cover layer has a multilayer structure including a lower layer that is made of a material including at least one of an epoxy resin, urethane, phenol, a polyester, benzocyclobutene, and polybenzoxazole and an upper layer that is made of a material including at least one of a polyimide, an epoxy resin, benzocyclobutene, polybenzoxazole, silicon, a silicon oxide, lithium tantalate, and lithium niobate.

17. The surface acoustic wave device according to claim 1, further comprising:
a reception filter;
a transmission filter;
an intermediate region disposed between the reception filter and the transmission filter; wherein
the reception filter and the transmission filter are defined by the interdigital transducer electrode.

18. The surface acoustic wave device according to claim 17, wherein the first partition-support layer and the second partition-support layer are disposed in the intermediate region.

* * * * *